United States Patent
Kato et al.

(10) Patent No.: US 9,324,753 B2
(45) Date of Patent: Apr. 26, 2016

(54) SOLID-STATE IMAGING DEVICE, METHOD OF MANUFACTURING A SOLID-STATE IMAGING DEVICE, AND ELECTRONIC APPARATUS

(71) Applicant: Sony Corporation, Tokyo (JP)

(72) Inventors: Nanako Kato, Kanagawa (JP); Toshifumi Wakano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/531,547

(22) Filed: Nov. 3, 2014

(65) Prior Publication Data

US 2015/0129943 A1    May 14, 2015

(30) Foreign Application Priority Data

Nov. 8, 2013   (JP) ................................ 2013-231975

(51) Int. Cl.
   *H01L 27/146*   (2006.01)

(52) U.S. Cl.
   CPC ...... *H01L 27/14623* (2013.01); *H01L 27/1461* (2013.01); *H01L 27/1464* (2013.01); *H01L 27/14612* (2013.01); *H01L 27/14614* (2013.01); *H01L 27/14627* (2013.01); *H01L 27/14638* (2013.01); *H01L 27/14685* (2013.01); *H01L 27/14687* (2013.01); *H01L 27/14689* (2013.01)

(58) Field of Classification Search
   CPC ............................................... H01L 27/14623
   See application file for complete search history.

(56) References Cited

U.S. PATENT DOCUMENTS

| | | | | |
|---|---|---|---|---|
| 5,608,455 A | * | 3/1997 | Oda ..................... | H04N 5/2176 348/243 |
| 6,429,036 B1 | * | 8/2002 | Nixon ............... | H01L 27/14618 438/458 |
| 6,580,457 B1 | * | 6/2003 | Armstrong ............ | H04N 5/335 348/302 |
| 7,498,650 B2 | * | 3/2009 | Lauxtermann .... | H01L 27/14603 257/460 |
| 7,531,884 B2 | * | 5/2009 | Kim .................. | H01L 27/14603 257/292 |
| 8,338,856 B2 | * | 12/2012 | Tai .................... | H01L 27/14638 257/184 |
| 8,530,264 B2 | * | 9/2013 | De Munck ........ | H01L 27/14683 257/233 |
| 8,541,857 B2 | * | 9/2013 | Ahn .................... | H01L 27/1461 257/432 |
| 8,629,484 B2 | * | 1/2014 | Ohri ................. | H01L 27/14607 257/290 |
| 8,716,719 B2 | * | 5/2014 | Matsumura ....... | H01L 27/14612 257/293 |

FOREIGN PATENT DOCUMENTS

| | | |
|---|---|---|
| JP | 2010-212668 A | 9/2010 |
| JP | 2011-166170 A | 8/2011 |
| JP | 2012-084644 A | 4/2012 |

\* cited by examiner

*Primary Examiner* — Evan Pert
(74) *Attorney, Agent, or Firm* — Sheridan Ross P.C.

(57) ABSTRACT

Provided is a solid-state imaging device including a lamination-type backside illumination CMOS (Complementary Metal Oxide Semiconductor) image sensor having a global shutter function. The solid-state imaging device includes a separation film including one of a light blocking film and a light absorbing film between a memory and a photo diode.

15 Claims, 10 Drawing Sheets

SOLID-STATE IMAGING DEVICE, METHOD OF MANUFACTURING A SOLID-STATE IMAGING DEVICE, AND ELECTRONIC APPARATUS

CROSS REFERENCE TO RELATED APPLICATIONS

This application claims the benefit of Japanese Priority Patent Application JP 2013-231975 filed Nov. 8, 2013, the entire contents of which are incorporated herein by reference.

BACKGROUND

The present disclosure relates to a solid-state imaging device, a method of manufacturing a solid-state imaging device, and an electronic apparatus, and more particularly, to a solid-state imaging device, a method of manufacturing a solid-state imaging device, and an electronic apparatus that are capable of suppressing the generation of aliasing and improving the saturation signal amounts of a photo diode (PD) and a memory and sensitivity of the photo diode.

In a backside illumination CMOS (Complementary Metal Oxide Semiconductor) image sensor having a global shutter function in related art, a photo diode (PD) and a memory that temporarily accumulates charge (signal) transferred from the photo diode are provided on the same plane of a substrate.

For that reason, an area where each of the photo diode and the memory is provided is limited, and this prevents saturation signal amounts of the photo diode and the memory from being increased or sensitivity of the photo diode from being improved.

In this regard, these days, a lamination-type backside illumination CMOS image sensor having a global shutter function is developed (Japanese Patent Application Laid-open Nos. 2012-084644, 2010-212668, and 2011-166170).

In the lamination-type backside illumination CMOS image sensor having a global shutter function, a photo diode is disposed on a light incident side and a memory is laminated on a wiring layer side, and thus areas of the photo diode and the memory can be enlarged at the same pixel pitch as well.

As a result, it is possible to increase the saturation signal amounts of the photo diode and the memory and improve the sensitivity of the photo diode.

SUMMARY

In the lamination-type backside illumination CMOS image sensor having a global shutter function, however, the photo diode and the memory are configured so as to be separated from each other by a dopant, and thus incident light from the backside surface passes through the photo diode and an element separation film and enters the memory in some cases.

In this case, the incident light may be subjected to photoelectric conversion in the memory and detected as aliasing at an unintended timing.

Further, also in the lamination-type backside illumination CMOS image sensor having a global shutter function, a space for providing each of the photo diode and the memory is limited, and this prevents the saturation signal amounts of the photo diode and the memory from being increased and the sensitivity of the photo diode from being improved.

In view of the circumstances as described above, in particular, it is desirable to provide a light blocking film or a light absorbing film that blocks or absorbs, respectively, light that passes through the photo diode, as a separation film that separates the photo diode and the memory from each other, to thus suppress the entry of the light to the memory and suppress the generation of aliasing. Additionally, it is also desirable to increase spaces for the photo diode and the memory in size, to thus increase the saturation signal amounts of the photo diode and the memory and improve the sensitivity of the photo diode.

According to an embodiment of the present disclosure, there is provided a solid-state imaging device including a lamination-type backside illumination CMOS (Complementary Metal Oxide Semiconductor) image sensor having a global shutter function, the solid-state imaging device including a separation film including one of a light blocking film and a light absorbing film between a memory and a photo diode.

The solid-state imaging device may further include a vertical transistor configured to transfer charge from the photo diode to the memory.

The solid-state imaging device may further include a floating diffusion, in which the vertical transistor may be disposed at an end of the photo diode such that a pitch of the photo diode coincides with a pitch of the vertical transistor, the memory, and the floating diffusion.

The solid-state imaging device may further include a floating diffusion, in which the vertical transistor may be disposed at the center of the photo diode such that a pitch of the photo diode coincides with a pitch of the vertical transistor, the memory, and the floating diffusion.

The solid-state imaging device may further include a floating diffusion, in which the photo diode, the memory, and the floating diffusion may be provided on respective layers and laminated on one another, to form a three-layer structure.

The separation film including the light blocking film may be formed of metal.

A negative potential may be applied to the separation film including the light blocking film and being formed of metal.

The separation film including the light blocking film and being formed of metal may be connected to an outside of a pixel array.

The separation film including the light absorbing film may include a film formed of a compound semiconductor having a chalcopyrite structure.

According to another embodiment of the present disclosure, there is provided an electronic apparatus including a solid-state imaging device including a lamination-type backside illumination CMOS (Complementary Metal Oxide Semiconductor) image sensor having a global shutter function, the electronic apparatus including a separation film including one of a light blocking film and a light absorbing film between a memory and a photo diode.

According to another embodiment of the present disclosure, there is provided a method of manufacturing a solid-state imaging device including a lamination-type backside illumination CMOS (Complementary Metal Oxide Semiconductor) image sensor having a global shutter function, the solid-state imaging device including a separation film including one of a light blocking film and a light absorbing film between a memory and a photo diode, the method including: a first step of forming an insulating film on one surface of a first substrate on which the memory is formed and an insulating film on one surface of a second substrate on which the photo diode is formed, and forming the separation film on the insulating film of the first substrate and the separation film on the insulating film of the second substrate; a second step of bonding the first substrate and the second substrate to each other, with the surface of the first substrate on which the separation film is formed and the surface of the second substrate on which the separation film is formed facing each other, to form an integrated substrate; and a third step of thinning the integrated substrate.

The first step may include forming an SCF (Si cover film) on each of the one surface of the first substrate and the one surface of the second substrate before the insulating films are formed.

The method of manufacturing a solid-state imaging device may further include a fourth step of forming the photo diode on a surface that is different from the surface of the second substrate on which the insulating film is formed, after the insulating films and the separation films are formed in the first step and before the second step is performed.

The method of manufacturing a solid-state imaging device may further include a fourth step of forming the photo diode on a surface that is different from the surface of the second substrate on which the insulating film is formed, after the third step is performed.

According to another embodiment of the present disclosure, there is provided a solid-state imaging device manufactured by a method of manufacturing a solid-state imaging device including a lamination-type backside illumination CMOS (Complementary Metal Oxide Semiconductor) image sensor having a global shutter function, the solid-state imaging device including a separation film including one of a light blocking film and a light absorbing film between a memory and a photo diode, the method including: a first step of forming an insulating film on one surface of a first substrate on which the memory is formed and an insulating film on one surface of a second substrate on which the photo diode is formed, and forming the separation film on the insulating film of the first substrate and the separation film on the insulating film of the second substrate; a second step of bonding the first substrate and the second substrate to each other, with the surface of the first substrate on which the separation film is formed and the surface of the second substrate on which the separation film is formed facing each other, to form an integrated substrate; and a third step of thinning the integrated substrate.

In one embodiment of the present disclosure, the solid-state imaging device including a lamination-type backside illumination CMOS (Complementary Metal Oxide Semiconductor) image sensor having a global shutter function includes a separation film including one of a light blocking film and a light absorbing film between a memory and a photo diode.

According to one embodiment of the present disclosure, particularly, it is possible to suppress the generation of aliasing in the imaging of a solid-state imaging device, and to increase the saturation signal amounts and the sensitivity of a photo diode (PD) and a memory.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, modes for carrying out the present disclosure (hereinafter, referred to as embodiments) will be described. It should be noted that description will be given in the following order.

1. First Embodiment (example of connecting vertical transistor to end of photo diode)
2. Second Embodiment (example of connecting vertical transistor to center of photo diode)
3. Third Embodiment (example of connecting photo diode and transistor by implant plug)
4. Fourth Embodiment (example of laminating photo diode, memory, and floating diffusion in three layers)
5. Fifth Embodiment (example of manufacturing method when photo diode is first provided on substrate)
6. Sixth Embodiment (example of manufacturing method when photo diode is lastly provided on substrate)

1. First Embodiment

Structure of General Solid-State Imaging Device

Figure 1:
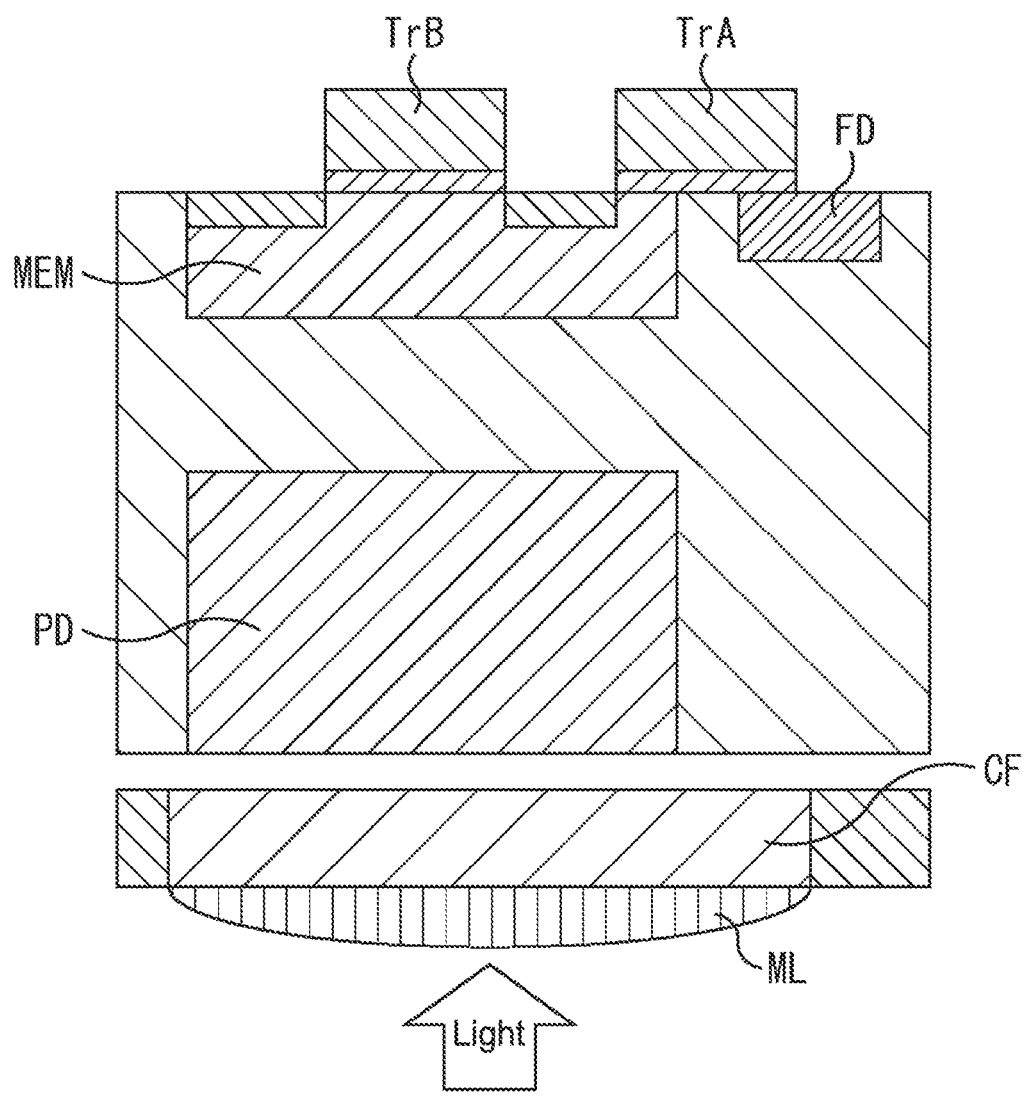
FIG. 1 is a sectional side view of a structure example of a solid-state imaging device in related art.

FIG. 1 is a sectional side view of a solid-state imaging device that forms a backside illumination CMOS (Complementary Metal Oxide Semiconductor) image sensor with a global shutter function, which has been generally used in the past.

The backside illumination CMOS image sensor with a global shutter function includes a microlens ML, a color filter CF, a photo diode PD, a memory MEM, a floating diffusion FD, and transistors TrA and TrB, which are disposed in the stated order from the bottom of FIG. 1 in a light incident direction.

The microlens ML inputs the incident light into the color filter CF in a subsequent stage. The color filter CF causes the incident light with the addition of a color of R, G, B, or the like to pass therethrough and inputs the light into the photo diode PD. The photo diode PD generates charge by photoelectric conversion based on the incident light, the charge corresponding to the amount of the incident light. The transistor TrB transfers the charge generated in the photo diode PD to the memory MEM at a predetermined timing based on a control signal from a controller (not shown). Further, the transistor TrA transfers the charge accumulated in the memory MEM to the floating diffusion FD at a predetermined timing based on a control signal from the controller (not shown). An amplification transistor (not shown) generates an amplified signal corresponding to the charge supplied from the floating diffusion FD. The amplified signal is output as a light receiving signal at a predetermined timing via a selected transistor.

Incidentally, as shown in FIG. 1, the solid-state imaging device in related art blocks or absorbs light that passes through the photo diode PD and enters the memory MEM, and thus it has been necessary to separate the elements by a dopant made of silicon Si to provide a predetermined space.

For that reason, in the case where a pixel pitch is set to be constant, spaces for providing the photo diode PD and the memory MEM are limited and are difficult to increase in a predetermined size or more. So, the increase in saturation signal amount or in sensitivity of each of the photo diode PD and the memory MEM is limited. Additionally, the light that has passed through the photo diode PD is hard to completely block or absorb by the silicon Si that forms a substrate. Thus, the light that has passed through the photo diode PD enters the memory MEM, and as a result, the photoelectric conversion occurs in the memory MEM and this leads to the generation of aliasing in some cases.

In this regard, in the present disclosure, a thin separation film that blocks or absorbs the light passing through the photo diode PD is provided between the photo diode PD and the memory MEM, and thus the generation of aliasing is suppressed. Additionally, the spaces for the photo diode PD and the memory MEM are increased in size, and thus the saturation signal amount is increased and the sensitivity of the photo diode PD is improved. Hereinafter, description will be given on a solid-state imaging device to which an embodiment of the present disclosure is applied.

(Circuit Configuration Example of Solid-State Imaging Device to which Embodiment of Present Disclosure is Applied)

Figure 2:
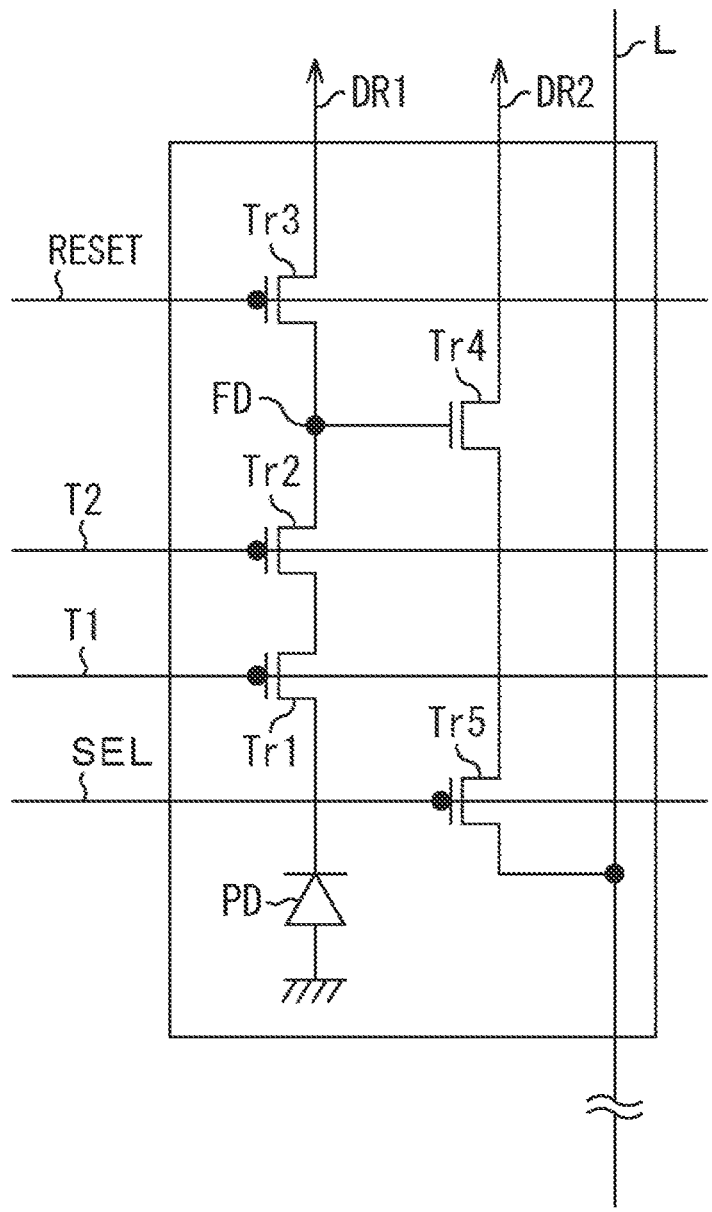
FIG. 2 is a diagram showing a circuit configuration example of a solid-state imaging device to which an embodiment of the present disclosure is applied.

Before description is given on a solid-state imaging device to which an embodiment of the present disclosure is applied, first, an electrical circuit configuration example of the solid-state imaging device to which an embodiment of the present disclosure is applied will be described with reference to FIG. 2. It should be noted that FIG. 2 shows a circuit configuration example of one pixel in the solid-state imaging device. Actually, the same circuit is formed for each of a plurality of pixels forming a pixel array.

The circuit configuration of one pixel in the solid-state imaging device includes a photo diode PD, transistors Tr1 to Tr5, and drain terminals DR1 and DR2.

The photo diode PD performs photoelectric conversion on incident light, generates charge corresponding to the amount of received light, and accumulates the generated charge.

Figure 3:
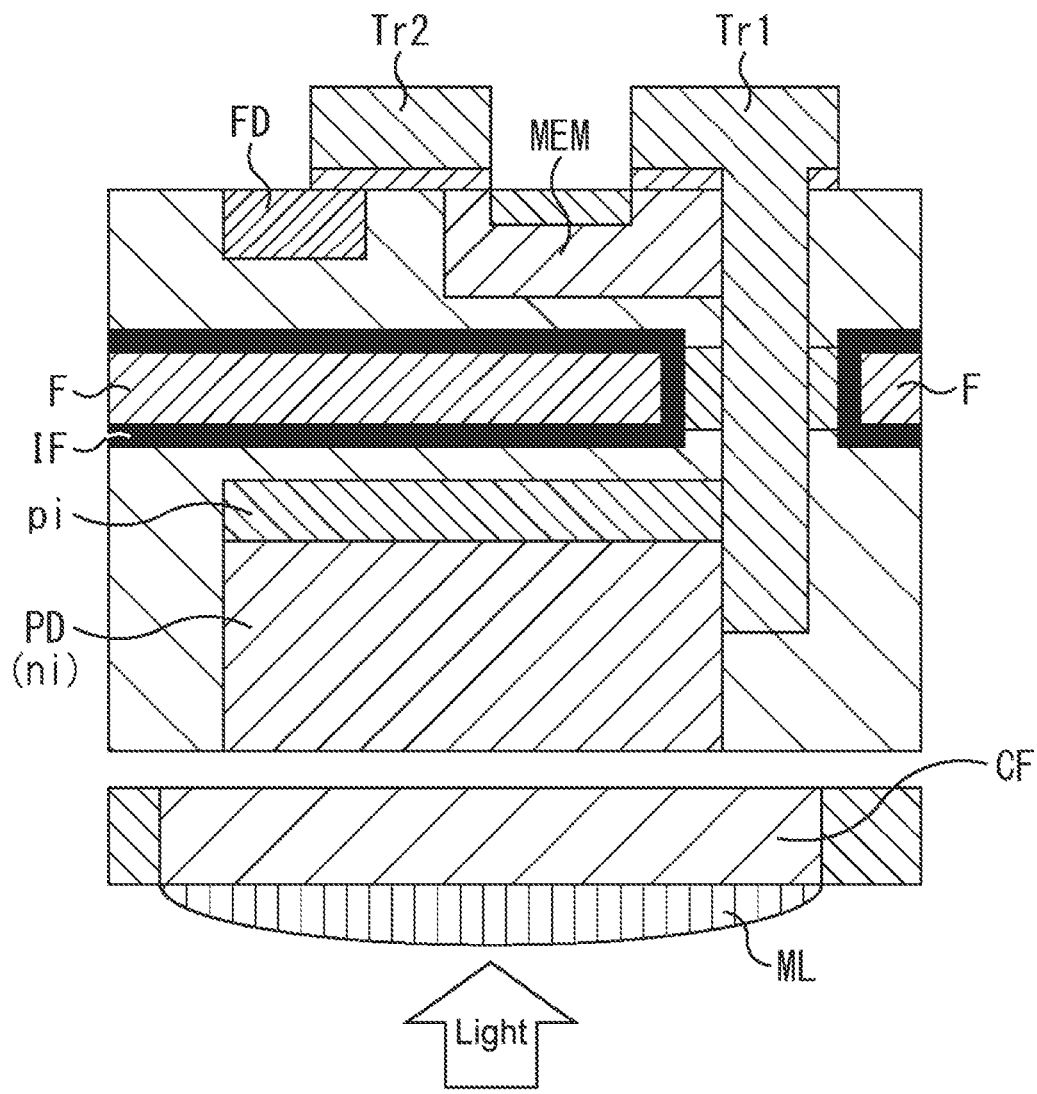
FIG. 3 is a first sectional side view of a structure example of a solid-state imaging device to which an embodiment of the present disclosure is applied.

The transistor Tr1 operates based on a transfer signal supplied at a predetermined timing from a controller (not shown) via a transfer signal line T1 and transfers the charge accumulated in the photo diode PD to the memory MEM (FIG. 3).

The transistor Tr2 operates based on a transfer signal supplied at a predetermined timing from a controller (not shown) via a transfer signal line T2 and transfers the charge accumulated in the memory MEM (FIG. 3) to the floating diffusion FD.

The transistor Tr3 operates based on a reset signal supplied at a predetermined timing from a controller (not shown) via a reset signal line RESET and discharges the charge accumulated in the floating diffusion FD from the drain terminal DR1.

The transistor Tr4 is what is called amplification transistor, and amplifies a voltage between a source and a drain with a voltage corresponding to the charge accumulated in the floating diffusion FD being as a gate signal, to supply a pixel signal (light receiving signal) to the transistor Tr5.

The transistor Tr5 operates based on a selection signal supplied at a predetermined timing from a controller (not shown) via a selection signal line SEL and outputs the pixel signal supplied from the transistor Tr4 functioning as an amplification transistor to a vertical signal line L.

(First Structure Example of Solid-State Imaging Device to which Embodiment of Present Disclosure is Applied)

Next, a first structure example of a solid-state imaging device to which an embodiment of the present disclosure is applied will be described with reference to FIG. 3. It should be noted that FIG. 3 shows a structure example of a cross section of a side surface of a substrate that is made of silicon Si and forms a solid-state imaging device corresponding to one pixel, and shows that light comes from the bottom of FIG. 3 in an upward direction.

An incident surface formed by the lower portion of the substrate made of silicon Si is provided with a microlens ML, and the microlens ML inputs the incident light into a color filter CF. The color filter CF is provided with a filter of a predetermined color, for example, R, G, or B (Red, Green, or Blue), and adds a color to the incident light input via the microlens ML and inputs the incident light into a photo diode PD. Further, though not shown in FIG. 3, the incident surface is provided with a light blocking portion between pixels, in addition to the color filter CF and the microlens ML. Thus, light blocking between pixels is performed.

The photo diode PD formed of an implant ni and an implant pi is provided on the color filter CF of FIG. 3. The implant ni is formed of an n-type element and formed on the substrate, and the implant pi is formed of a p-type element and formed on the implant ni.

On the other hand, the memory MEM and the floating diffusion FD are formed on the upper portion of the substrate of FIG. 3. Further, the transistor Tr1 including a vertical transistor that transfers the charge accumulated in the photo diode PD to the memory MEM is provided on the upper surface portion of the substrate. Further, the transistor Tr2 for transferring the charge accumulated in the memory MEM to the floating diffusion FD is provided on the upper surface of the substrate.

The photo diode PD and the memory MEM each have a HAD (Hole Accumulation Diode) structure including a hole accumulation layer on its front surface, the structure reducing noise by suppressing the generation of a dark current occurring from the front surface.

Further, a separation film F is provided between the photo diode PD and the memory MEM. The separation film F blocks or absorbs light that may pass through the photo diode PD and enter the memory MEM. An insulating film IF is formed between the separation film F and silicon Si forming the substrate, around the separation film F, and is in an electrically isolated state.

It should be noted that the transistor Tr1 formed of a vertical transistor is formed by penetrating the separation film F, engraving a vertical poly-Si (polysilicon), and making the surface as a channel, and is configured to connect ends of the photo diode PD and the memory MEM so as to fall within the pitch of the photo diode PD.

Further, the separation film F is formed as a light blocking film, which blocks light that may pass through the photo diode PD and enter the memory MEM, of a metal film made of tungsten or the like, for example. In the case where the separation film F is formed of a metal film, the separation film F has a film thickness set to about several hundreds of nm and is connected to an electrode (not shown) in an area outside the pixel array. This allows electrons around the separation film F from floating.

In such a manner, since the separation film F formed of the light blocking film blocks the light that passes through the photo diode PD, aliasing generated in the memory MEM can be reduced. Further, since light blocking can be performed if a space for providing the separation film F is provided between the photo diode PD and the memory MEM, it is possible to omit a space used for reducing the light that passes through the substrate when silicon Si is used to form the substrate. As a result, the spaces for the photo diode PD and the memory MEM can be increased in size, and thus the saturation signal amounts can be increased. Further, for the photo diode PD, the saturation signal amount can be increased and its sensitivity can be improved.

Furthermore, the separation film F can also be formed as a light absorbing film, which absorbs light that may pass through the photo diode PD and enter the memory MEM, of a compound semiconductor having a chalcopyrite structure, for example. Examples of the compound semiconductor having a chalcopyrite structure include $CuInSe_2$. In the case where the separation film F is formed of the compound semiconductor having the chalcopyrite structure, the film thickness thereof is set to about several hundreds of nm to several μm. Further, other examples of the compound semiconductor having the chalcopyrite structure may include, in addition to $CuInSe_2$, a compound semiconductor made of copper-aluminum-gallium-indium-sulfur-selenium-based mixed crystal or a compound semiconductor made of copper-aluminum-gallium-indium-zinc-sulfur-selenium-based mixed crystal. Other compound semiconductors may also be used as long as they are compound semiconductors each having the chalcopyrite structure capable of absorbing light.

In such a manner, since the separation film F formed of the light absorbing film absorbs the light that passes through the photo diode PD, aliasing generated in the memory MEM can be reduced. Further, since light absorption can be performed if a space for providing the separation film F is provided between the photo diode PD and the memory MEM, it is possible to omit a space used for reducing the light that passes through the substrate when silicon Si is used to form the substrate. As a result, the spaces for the photo diode PD and the memory MEM can be increased in size, and thus the saturation signal amounts can be increased. Further, for the photo diode PD, the saturation signal amount can be increased and its sensitivity can be improved.

2. Second Embodiment

Second Structure Example of Solid-State Imaging Device to which Embodiment of Present Disclosure is Applied In the above description, the example in which the transistor Tr1 formed of the vertical transistor is configured to connect the ends of the photo diode PD and the memory MEM so as to fall within the pitch of the photo diode PD has been described. In such a case, the maximum distance in which the charge within the photo diode PD moves to the vertical poly-Si is equal to a width in a horizontal direction of the photo diode PD. However, when the end of the poly-Si transistor Tr1 formed of the vertical transistor is configured to come into contact with the vicinity of the center in the horizontal direction of the photo diode PD, the maximum movement distance of the charge within the photo diode PD can be reduced to half of the width in the horizontal direction of the photo diode.

Figure 4:
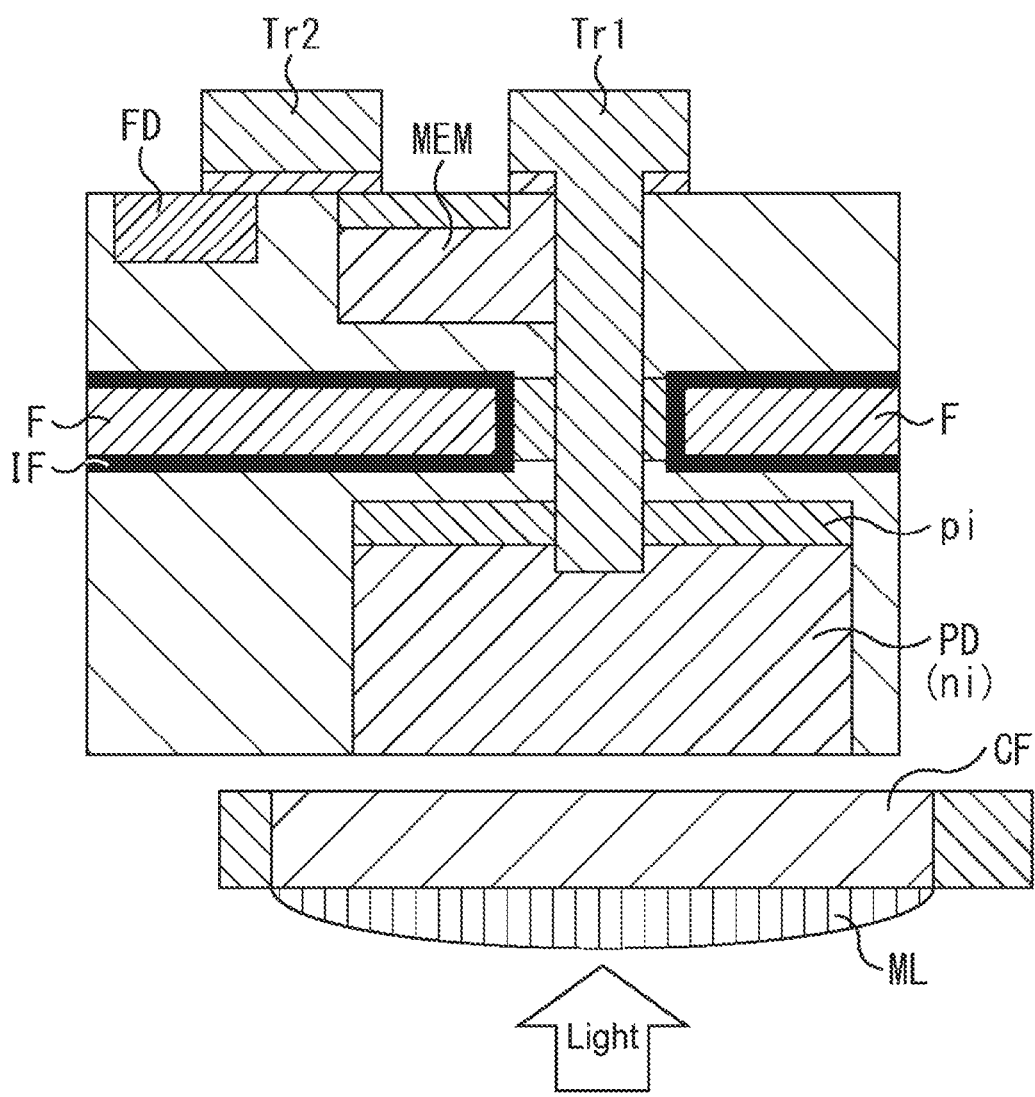
FIG. 4 is a second sectional side view of a structure example of a solid-state imaging device to which an embodiment of the present disclosure is applied.

FIG. 4 shows a second structure example of a solid-state imaging device in which the end of the poly-Si transistor Tr1 formed of the vertical transistor is configured to come into contact with the vicinity of the center in the horizontal direction of the photo diode PD. It should be noted that configurations having the same functions as those of the configuration of the solid-state imaging device of FIG. 3 are denoted by the same reference symbols and provided with the same names, and description thereof will be omitted as appropriate.

Specifically, the solid-state imaging device of FIG. 4 has a different configuration from the solid-state imaging device of FIG. 3, in that the end of the poly-Si transistor Tr1 formed of the vertical transistor is configured to come into contact with the vicinity of the center in the horizontal direction of the photo diode PD. It should be noted that in FIG. 4, since the position of the photo diode PD with respect to the transistor Tr1 is shifted to the right-hand side of FIG. 4 in the horizontal direction, the microlens ML and the color filter CF of FIG. 4 are also shifted in the horizontal direction similar to the photo diode PD, with respect to the microlens ML and the color filter CF of FIG. 3.

Specifically, with such a configuration, it is possible to reduce the maximum distance, in which the charge within the photo diode PD reaches the end of the poly-Si transistor Tr1 formed of the vertical transistor, to half of the width in the horizontal direction of the photo diode PD. Consequently, the solid-state imaging device of FIG. 4 can not only produce the same effects as those in the solid-state imaging device of FIG. 3 but also shorten a charge transfer time.

3. Third Embodiment

Third Structure Example of Solid-State Imaging Device to which Embodiment of Present Disclosure is Applied In the above description, the example in which the transistor Tr1 is formed of the vertical transistor has been described. However, it may be possible to use the transistor Tr1 as a normal horizontal transistor and to connect the transistor Tr1 to the photo diode PD with an implant plug instead of the p-type dopant.

Figure 5:
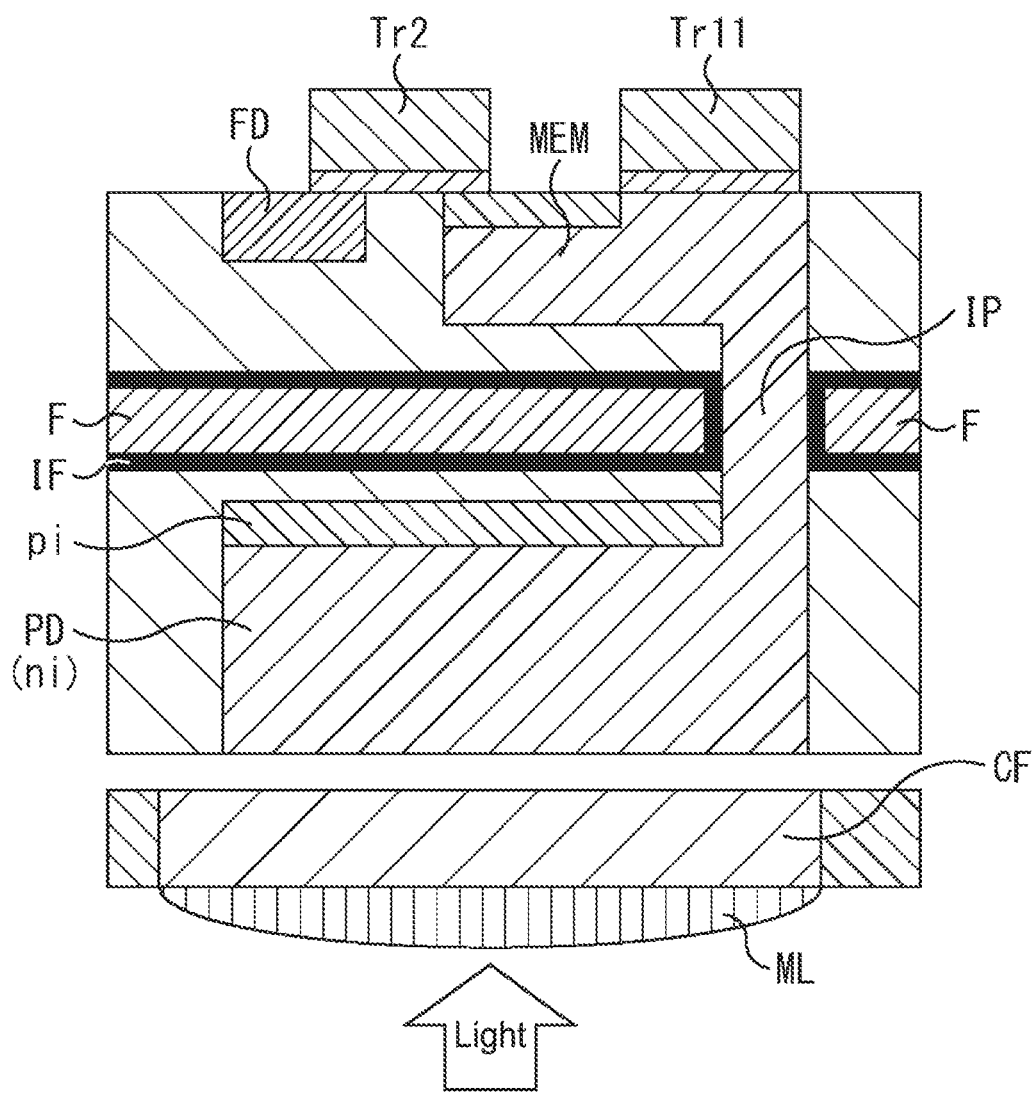
FIG. 5 is a third sectional side view of a structure example of a solid-state imaging device to which an embodiment of the present disclosure is applied.

FIG. 5 shows a third structure example of a solid-state imaging device in which the transistor Tr1 is used as a normal horizontal transistor and the photo diode PD and the memory MEM are connected to each other with an implant plug instead of the poly-Si. It should be noted that in the solid-state imaging device of FIG. 5, configurations having the same functions as those of the configuration of the solid-state imaging device of FIG. 3 are denoted by the same reference symbols and provided with the same names, and description thereof will be omitted as appropriate.

Specifically, the structure example of the solid-state imaging device of FIG. 5 is different from the structure example of the solid-state imaging device of FIG. 3 in that a transistor Tr11 formed of a normal horizontal transistor and an implant plug IP are provided instead of the transistor Tr1 formed of the vertical transistor.

The function of the transistor Tr11 is basically the same as that of the transistor Tr1, but the charge is transferred via the implant plug IP instead of the poly-Si.

With such a configuration, it is possible to block or absorb light passing through the photo diode PD by the separation film F and to increase in size the spaces of the photo diode PD and the memory MEM, as in the solid-state imaging device of FIG. 3.

As a result, the generation of aliasing in the memory MEM can be suppressed and the saturation signal amounts of the photo diode PD and the memory MEM can be increased. Further, for the photo diode PD, the saturation signal amount can be increased and its sensitivity can also be improved.

4. Fourth Embodiment

Fourth Structure Example of Solid-State Imaging Device to which Embodiment of Present Disclosure is Applied In the above description, the example in which a two-layered structure is formed has been described, the two-layered structure including a layer as the upper surface of the substrate in the figures, on which the memory MEM and the floating diffusion FD are formed, and a layer of the photo diode PD as the lower surface, with the separation film F being sandwiched between the upper surface and the lower surface. However, it may be possible to laminate the floating diffusion FD on the memory MEM to form a three-layered structure of the floating diffusion FD, the memory MEM, and the photo diode PD.

Figure 6:
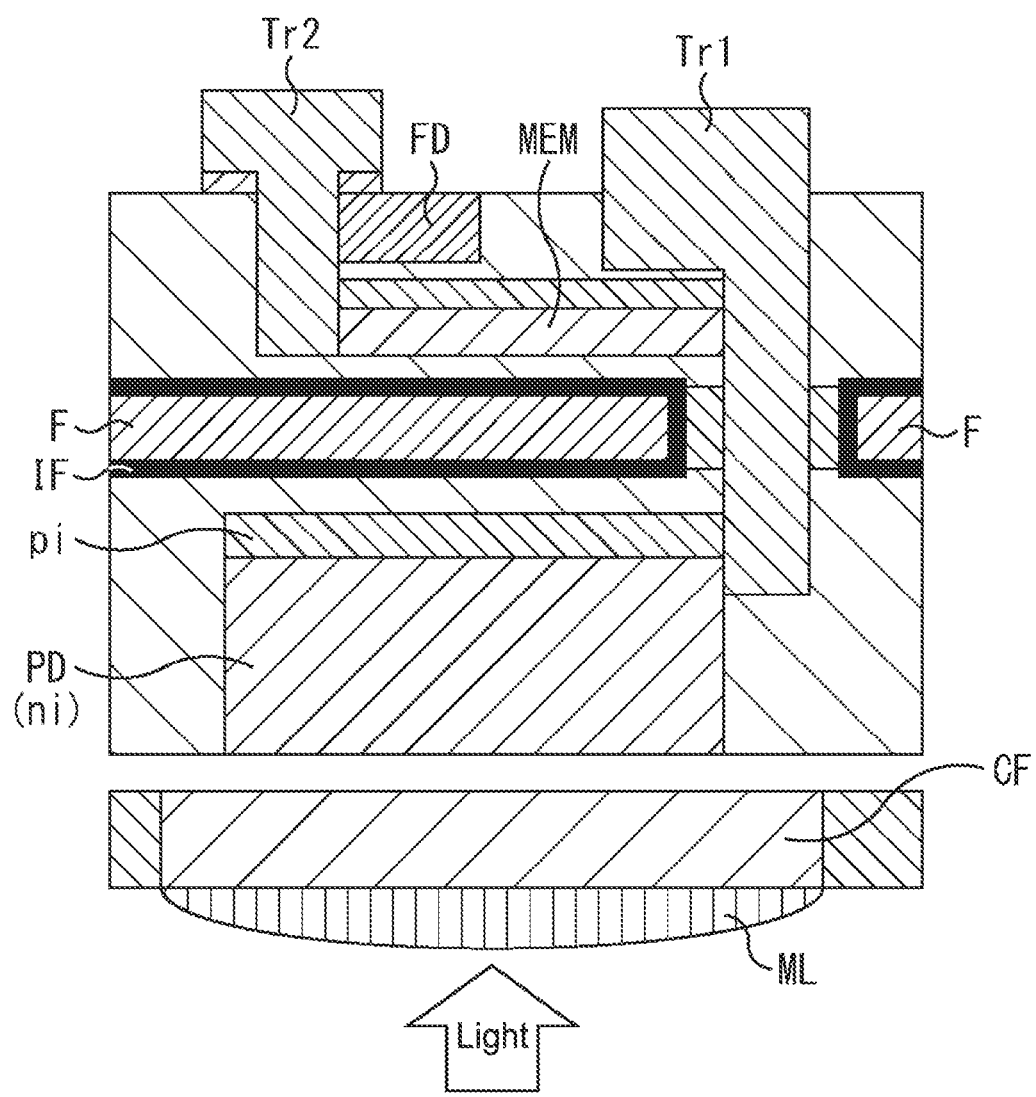
FIG. 6 is a fourth sectional side view of a structure example of a solid-state imaging device to which an embodiment of the present disclosure is applied.

FIG. 6 shows a fourth structure example of a solid-state imaging device having a three-layered structure of the floating diffusion FD, the memory MEM, and the photo diode PD by lamination of the floating diffusion FD on the memory MEM. It should be noted that in the solid-state imaging device of FIG. 6, configurations having the same functions as those of the configuration of the solid-state imaging device of FIG. 3 are denoted by the same reference symbols and provided with the same names, and description thereof will be omitted as appropriate.

Specifically, the structure example of the solid-state imaging device of FIG. 6 is different from the structure example of the solid-state imaging device of FIG. 3 in that the floating diffusion FD is laminated on the memory MEM, to form a three-layered structure of the floating diffusion FD, the memory MEM, and the photo diode PD.

With such a configuration, it is possible to increase a space ensured for the memory MEM in size while keeping pitches between pixels. Consequently, the solid-state imaging device of FIG. 6 can produce the same effects as those in the solid-state imaging device of FIG. 3 and further increase the saturation signal amount of the memory MEM.

5. Fifth Embodiment

Figure 7:
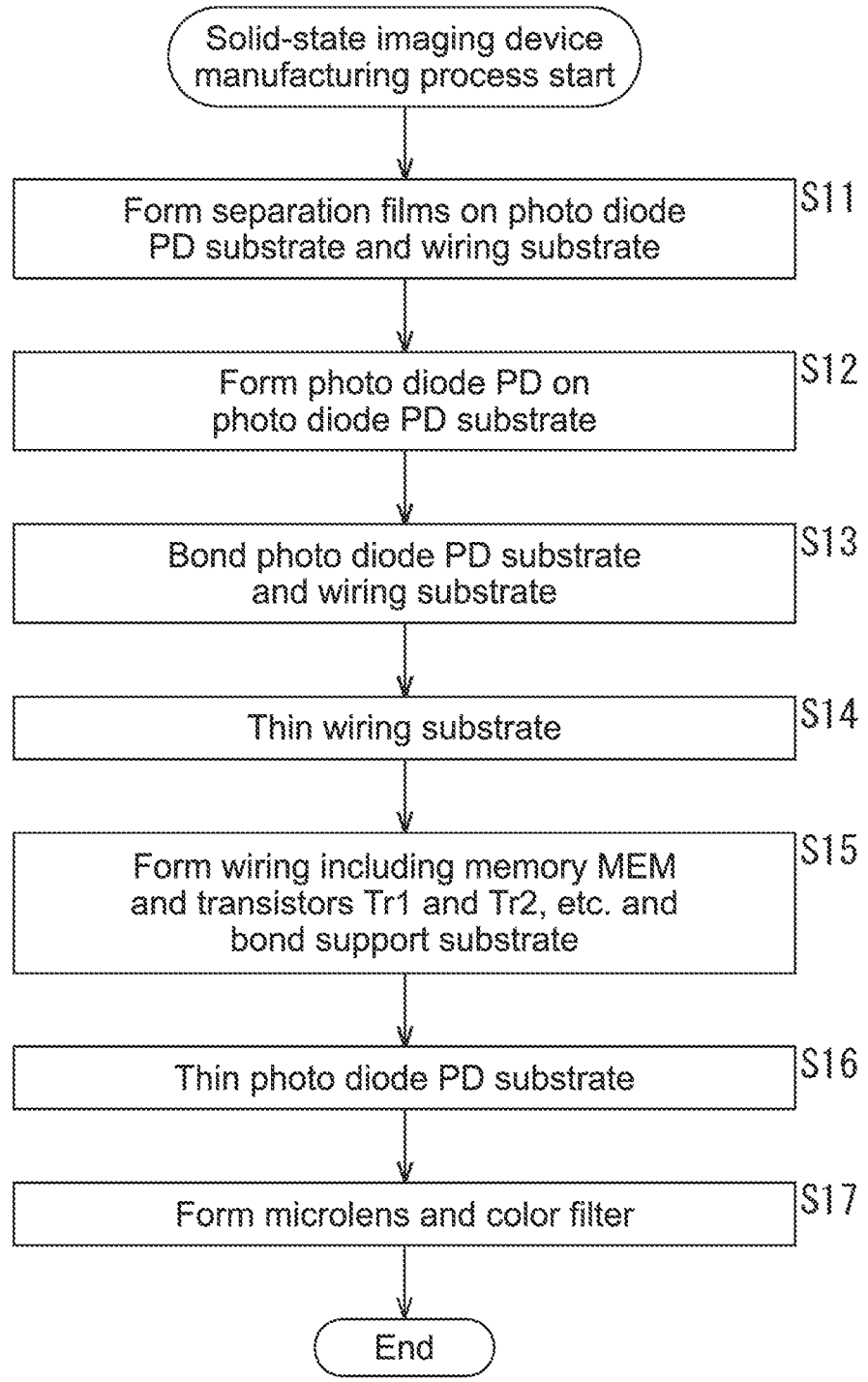
FIG. 7 is a flowchart for describing a first method of manufacturing a solid-state imaging device to which an embodiment of the present disclosure is applied.

First Method of Manufacturing Solid-State Imaging Device to which Embodiment of Present Disclosure is Applied Next, with reference to FIGS. 7 and 8, a first method of manufacturing a solid-state imaging device to which an embodiment of the present disclosure is applied will be described. It should be noted that here a method of manufacturing the solid-state imaging device of FIG. 3 is described with reference to a flowchart of FIG. 7, but other configurations are also manufactured by basically the same method.

Figure 8:
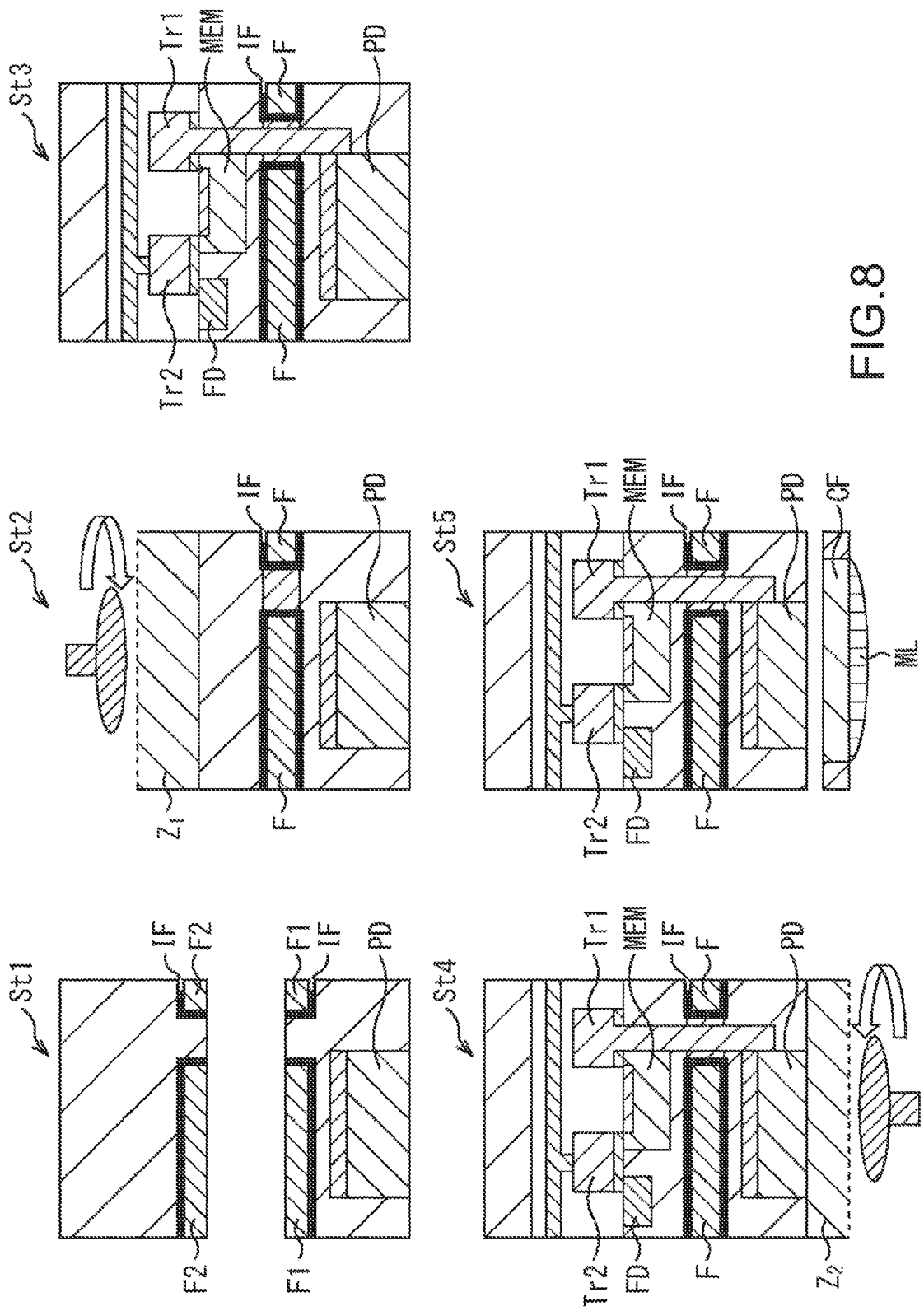
FIG. 8 is a diagram for describing the first method of manufacturing a solid-state imaging device to which an embodiment of the present disclosure is applied.

Specifically, in Step S11, an SCF (Si Cover Film) (not shown) formed of a hole accumulation layer including a negative fixed charge is formed on each of a surface of a photo diode PD substrate that is shown on the lower side in a state St1 of FIG. 8, and a surface of a wiring substrate that is shown on the upper side in the state St1 of FIG. 8, the surfaces being opposed to each other. Subsequently, insulating films IF indicated by bold black lines of FIG. 8 are formed on the SCFs, and separation films F1 and F2 are formed on the insulating films IF. It should be noted that the SCF is not an indispensable configuration, and thus a configuration having no SCF may be adopted.

At that time, a through-hole is formed as a pattern for forming a channel, made of poly-Si, of the transistor Tr1 serving as a vertical transistor. It should be noted that the SCF is formed, and thus a HAD (Hole Accumulation Diode) structure is provided to the bonded surfaces, and the generation of a dark current is suppressed. However, the SCF is not an indispensable configuration and may be omitted. Further, in the case where the separation films F1 and F2 (separation film F) are each made of a compound, the insulating film IF is an indispensable configuration, but in the case where the separation films F1 and F2 are each made of a metal film, the insulating film IF is not an indispensable configuration and may be omitted.

In Step S12, an n-type implant and a p-type implant are formed in the photo diode PD substrate shown on the lower side in the state St1 of FIG. 8, and thus a photo diode PD having a HAD structure is formed.

In Step S13, as shown in a state St2 of FIG. 8, the photo diode PD substrate and the wiring substrate are bonded to each other. In such a manner, the separation films F1 and F2 are bonded to each other, and thus a separation film F in a state being surrounded by the insulating film is integrally formed in the upper layer of the photo diode PD, which is the lower payer of the substrate made of silicon Si.

In Step S14, as shown on the upper side in the state St2 of FIG. 8, an area Z1 on the upper surface of the wiring substrate is polished by CMP (Chemical Mechanical Polishing) to thin the surface.

In Step S15, as shown in a state St3 of FIG. 8, wiring including a memory MEM, a floating diffusion FD, and transistors Tr1 and Tr2 is formed on the upper portion of the substrate made of silicon Si in FIG. 8. At that time, a support substrate is further bonded to the upper portion of the wiring. The support substrate may be a logic circuit substrate for image processing, for example.

In Step S16, as shown in a state St4 of FIG. 8, an area Z2 on the surface of the photo diode PD is polished such that the photo diode PD provided on the lower portion of the substrate made of silicon Si in FIG. 8 has a thickness with which light of a wavelength to be absorbed is easy to absorb. The target film thickness of the photo diode PD at that time is about several μm, for example.

In Step S17, as shown in a state St5 of FIG. 8, a microlens ML and a color filter CF are formed.

By the manufacturing method as described above, the separation film F that blocks or absorbs light passing through the photo diode PD is formed between the layer in which the photo diode PD is formed and the layer in which the memory MEM is formed. Thus, the generation of aliasing in the memory MEM can be suppressed. Further, the separation film F is an extremely-thin film as compared with the substrate material made of silicon Si in related art and can block or absorb light that passes through the photo diode PD, and thus it is possible to increase in size spaces for forming the photo diode PD and the memory MEM in the substrate without changing a pitch per pixel and to increase the saturation signal amounts of the photo diode PD and the memory MEM. Further, for the photo diode PD, the saturation signal amount can be increased as described above and its sensitivity can also be improved.

6. Sixth Embodiment

Second Method of Manufacturing Solid-State Imaging Device to which Embodiment of Present Disclosure is Applied In the above description, the example in which the photo diode PD is provided on the photo diode PD substrate, the SCFs, the insulating films IF, and the separation films F1 and F2 are provided on the opposed surfaces of the photo diode PD substrate and the wiring substrate, the photo diode PD substrate and the wiring substrate are bonded to each other such that the separation films F1 and F2 face each other to form the separation film F, and wiring and the like are provided has been described.

Incidentally, the photo diode PD is subjected to defect correction by annealing after implantation. In the current technology, however, laser annealing enables a local heat application, but has a difficulty in controlling the depth of the photo diode PD. For that reason, it is necessary to form and anneal the photo diode PD before the photo diode PD substrate and the wiring substrate are bonded to each other.

However, when the technology of laser annealing is improved in the future and the photo diode PD is subjected to defect correction and if a thermally-formed area can be controlled to the thickness thereof, it is also possible to provide the photo diode PD after bonding the substrates to each other and providing the wiring and the like.

Figure 9:
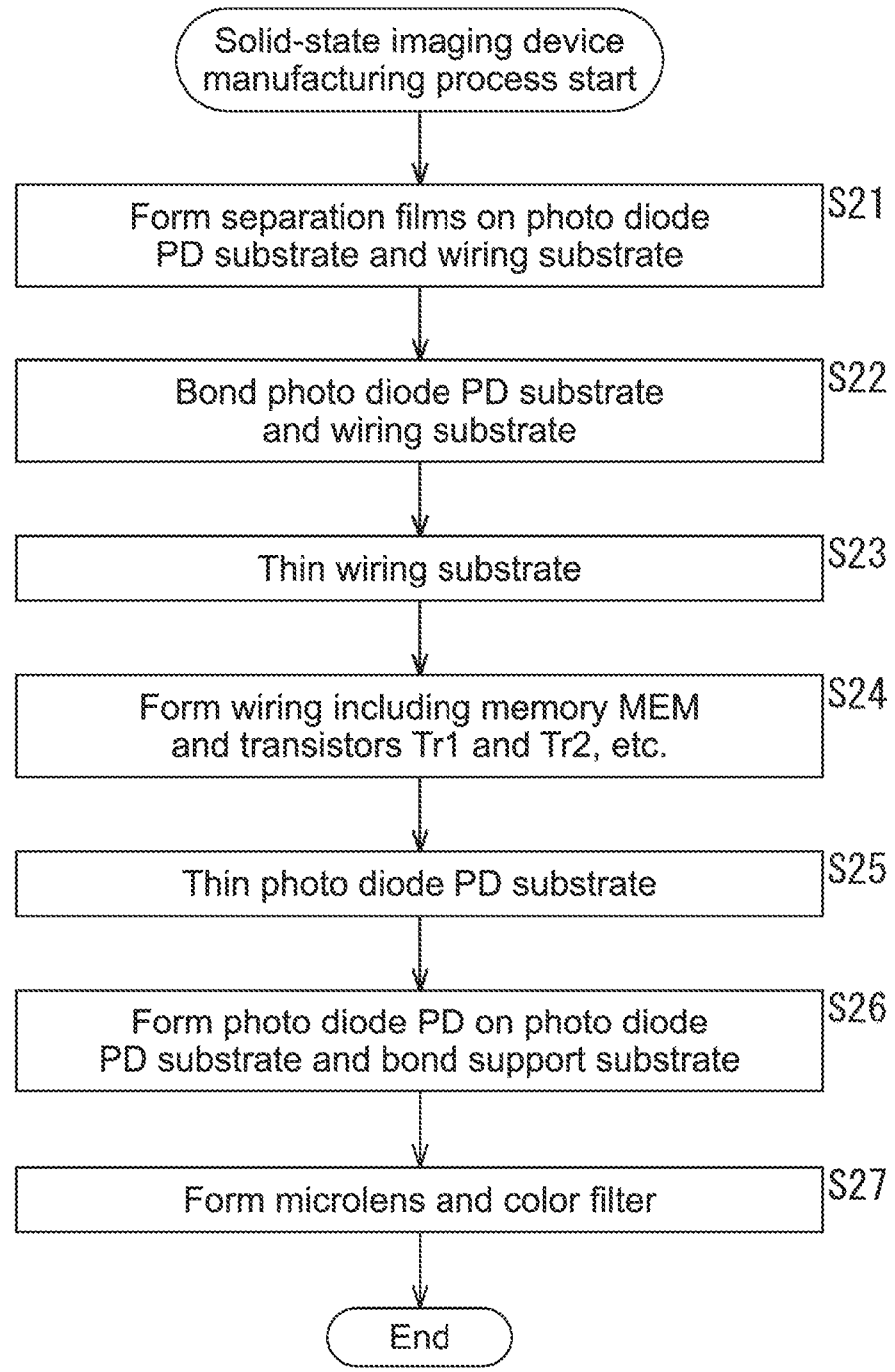
FIG. 9 is a flowchart for describing a second method of manufacturing a solid-state imaging device to which an embodiment of the present disclosure is applied.

FIG. 9 is a flowchart for describing a second method of manufacturing a solid-state imaging device, in which a photo diode PD is provided after a photo diode PD substrate and a wiring substrate are bonded to each other and wiring and the like are provided. It should be noted that the process steps of Step S21 to S25 and S27 in the flowchart of FIG. 9 are the same as those of Steps S11 and S13 to S17 in the flowchart of FIG. 7, and thus description thereof will be omitted.

The flowchart of FIG. 9 is different from the flowchart of FIG. 7 in that the process step of forming the photo diode PD is performed in Step S26, which is performed later than Step S22 as the process step of bonding the photo diode PD substrate and the wiring substrate to each other.

Figure 10:
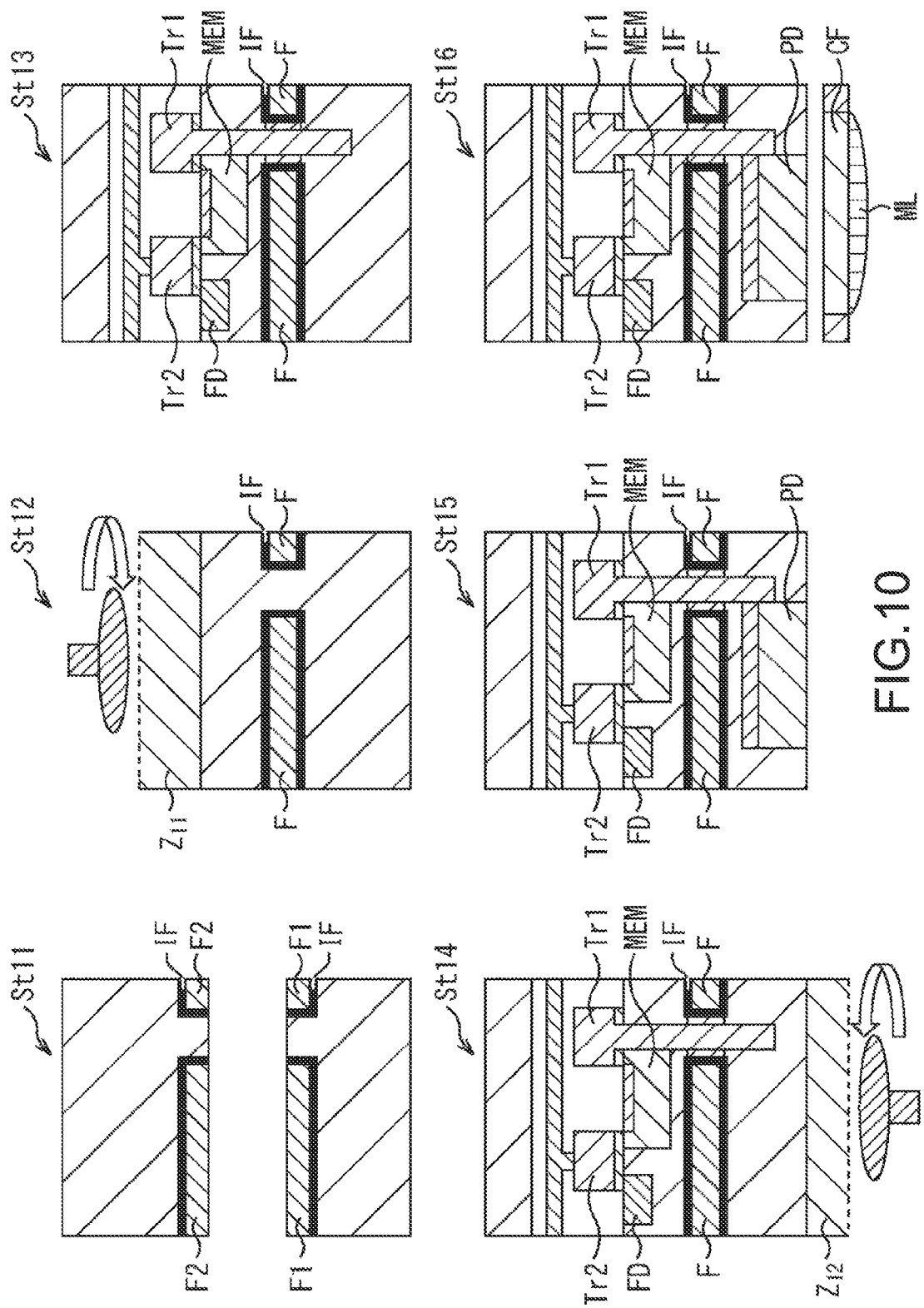
FIG. 10 is a diagram for describing the second method of manufacturing a solid-state imaging device to which an embodiment of the present disclosure is applied.

Specifically, in the second manufacturing method, the process steps of Steps S21 to S25 are first performed as shown in the states St11 to St14 of FIG. 10, as follows: a separation film F is formed; a photo diode PD substrate and a wiring substrate are bonded to each other; an area Z11 is polished to thin the wiring substrate; wiring and the like are formed; and an area Z12 is polished and thus the photo diode PD substrate is thinned. After those process steps area performed, as shown in the state St15 of FIG. 10, a photo diode PD is formed in a state where the film thickness is adjusted, by laser annealing in the process step of Step S26.

By the manufacturing method as described above, the separation film F that blocks or absorbs light passing through the photo diode PD is formed between the layer in which the photo diode PD is formed and the layer in which the memory MEM is formed. Thus, the generation of aliasing in the memory MEM can be suppressed. Further, the separation film F is an extremely-thin film as compared with the substrate material made of silicon Si in related art and can block or absorb light that passes through the photo diode PD, and thus it is possible to increase in size spaces for forming the photo diode PD and the memory MEM in the substrate without changing a pitch per pixel and to increase the saturation signal amounts of the photo diode PD and the memory MEM. Further, for the photo diode PD, the saturation signal amount can be increased as described above and its sensitivity can also be improved.

It should be noted that the embodiments of the present disclosure are not limited to the embodiments described above and can be variously modified without departing from the gist of the present disclosure.

Further, the present disclosure can have the following configurations.

(1) A solid-state imaging device including a lamination-type backside illumination CMOS (Complementary Metal Oxide Semiconductor) image sensor having a global shutter function, the solid-state imaging device including
a separation film including one of a light blocking film and a light absorbing film between a memory and a photo diode.

(2) The solid-state imaging device according to (1), further including a vertical transistor configured to transfer charge from the photo diode to the memory.

(3) The solid-state imaging device according to (2), further including a floating diffusion, in which
the vertical transistor is disposed at an end of the photo diode such that a pitch of the photo diode coincides with a pitch of the vertical transistor, the memory, and the floating diffusion.

(4) The solid-state imaging device according to (2), further including a floating diffusion, in which
the vertical transistor is disposed at the center of the photo diode such that a pitch of the photo diode coincides with a pitch of the vertical transistor, the memory, and the floating diffusion.

(5) The solid-state imaging device according to any one of (1) to (4), further including a floating diffusion, in which
the photo diode, the memory, and the floating diffusion are provided on respective layers and laminated on one another, to form a three-layer structure.

(6) The solid-state imaging device according to any one of (1) to (5), in which
the separation film including the light blocking film is formed of metal.

(7) The solid-state imaging device according to (6), in which
a negative potential is applied to the separation film including the light blocking film and being formed of metal.

(8) The solid-state imaging device according to (6), in which
the separation film including the light blocking film and being formed of metal is connected to an outside of a pixel array.

(9) The solid-state imaging device according to any one of (1) to (8), in which
the separation film including the light absorbing film includes a film formed of a compound semiconductor having a chalcopyrite structure.

(10) An electronic apparatus including a solid-state imaging device including a lamination-type backside illumination CMOS (Complementary Metal Oxide Semiconductor) image sensor having a global shutter function, the electronic apparatus including
a separation film including one of a light blocking film and a light absorbing film between a memory and a photo diode.

(11) A method of manufacturing a solid-state imaging device including a lamination-type backside illumination CMOS (Complementary Metal Oxide Semiconductor) image sensor having a global shutter function, the solid-state imaging device including a separation film including one of a light blocking film and a light absorbing film between a memory and a photo diode, the method including:
a first step of forming an insulating film on one surface of a first substrate on which the memory is formed and an insulating film on one surface of a second substrate on which the photo diode is formed, and forming the separation film on the insulating film of the first substrate and the separation film on the insulating film of the second substrate;

a second step of bonding the first substrate and the second substrate to each other, with the surface of the first substrate on which the separation film is formed and the surface of the second substrate on which the separation film is formed facing each other, to form an integrated substrate; and a third step of thinning the integrated substrate.

(12) The method of manufacturing a solid-state imaging device according to (11), in which the first step includes forming an SCF (Si cover film) on each of the one surface of the first substrate and the one surface of the second substrate before the insulating films are formed.

(13) The method of manufacturing a solid-state imaging device according to (12), further including a fourth step of forming the photo diode on a surface that is different from the surface of the second substrate on which the insulating film is formed, after the insulating films and the separation films are formed in the first step and before the second step is performed.

(14) The method of manufacturing a solid-state imaging device according to (12), further including a fourth step of forming the photo diode on a surface that is different from the surface of the second substrate on which the insulating film is formed, after the third step is performed.

(15) A solid-state imaging device manufactured by a method of manufacturing a solid-state imaging device including a lamination-type backside illumination CMOS (Complementary Metal Oxide Semiconductor) image sensor having a global shutter function, the solid-state imaging device including a separation film including one of a light blocking film and a light absorbing film between a memory and a photo diode, the method including:

a first step of forming an insulating film on one surface of a first substrate on which the memory is formed and an insulating film on one surface of a second substrate on which the photo diode is formed, and forming the separation film on the insulating film of the first substrate and the separation film on the insulating film of the second substrate;

a second step of bonding the first substrate and the second substrate to each other, with the surface of the first substrate on which the separation film is formed and the surface of the second substrate on which the separation film is formed facing each other, to form an integrated substrate; and a third step of thinning the integrated substrate.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device including a lamination-type backside illumination CMOS (Complementary Metal Oxide Semiconductor) image sensor having a global shutter function, the solid-state imaging device comprising
a separation film including one of a light blocking film and a light absorbing film between a memory and a photo diode.

2. The solid-state imaging device according to claim 1, further comprising a vertical transistor configured to transfer charge from the photo diode to the memory.

3. The solid-state imaging device according to claim 2, further comprising a floating diffusion, wherein
the vertical transistor is disposed at an end of the photo diode such that a pitch of the photo diode coincides with a pitch of the vertical transistor, the memory, and the floating diffusion.

4. The solid-state imaging device according to claim 2, further comprising a floating diffusion, wherein
the vertical transistor is disposed at the center of the photo diode such that a pitch of the photo diode coincides with a pitch of the vertical transistor, the memory, and the floating diffusion.

5. The solid-state imaging device according to claim 1, further comprising a floating diffusion, wherein
the photo diode, the memory, and the floating diffusion are provided on respective layers and laminated on one another, to form a three-layer structure.

6. The solid-state imaging device according to claim 1, wherein
the separation film including the light blocking film is formed of metal.

7. The solid-state imaging device according to claim 6, wherein
a negative potential is applied to the separation film including the light blocking film and being formed of metal.

8. The solid-state imaging device according to claim 6, wherein
the separation film including the light blocking film and being formed of metal is connected to an outside of a pixel array.

9. The solid-state imaging device according to claim 1, wherein
the separation film including the light absorbing film includes a film formed of a compound semiconductor having a chalcopyrite structure.

10. An electronic apparatus including a solid-state imaging device including a lamination-type backside illumination CMOS (Complementary Metal Oxide Semiconductor) image sensor having a global shutter function, the electronic apparatus comprising
a separation film including one of a light blocking film and a light absorbing film between a memory and a photo diode.

11. A method of manufacturing a solid-state imaging device including a lamination-type backside illumination CMOS (Complementary Metal Oxide Semiconductor) image sensor having a global shutter function, the solid-state imaging device including a separation film including one of a light blocking film and a light absorbing film between a memory and a photo diode, the method comprising:

a first step of forming an insulating film on one surface of a first substrate on which the memory is formed and an insulating film on one surface of a second substrate on which the photo diode is formed, and forming the separation film on the insulating film of the first substrate and the separation film on the insulating film of the second substrate;

a second step of bonding the first substrate and the second substrate to each other, with the surface of the first substrate on which the separation film is formed and the surface of the second substrate on which the separation film is formed facing each other, to form an integrated substrate; and a third step of thinning the integrated substrate.

12. The method of manufacturing a solid-state imaging device according to claim 11, wherein the first step includes forming an SCF (Si cover film) on each of the one surface of the first substrate and the one surface of the second substrate before the insulating films are formed.

13. The method of manufacturing a solid-state imaging device according to claim 12, further comprising a fourth step of forming the photo diode on a surface that is different from the surface of the second substrate on which the insulating film is formed, after the insulating films and the separation films are formed in the first step and before the second step is performed.

14. The method of manufacturing a solid-state imaging device according to claim 12, further comprising a fourth step of forming the photo diode on a surface that is different from the surface of the second substrate on which the insulating film is formed, after the third step is performed.

15. A solid-state imaging device manufactured by a method of manufacturing a solid-state imaging device including a lamination-type backside illumination CMOS (Complementary Metal Oxide Semiconductor) image sensor having a global shutter function, the solid-state imaging device including a separation film including one of a light blocking film and a light absorbing film between a memory and a photo diode, the method comprising:

a first step of forming an insulating film on one surface of a first substrate on which the memory is formed and an insulating film on one surface of a second substrate on which the photo diode is formed, and forming the separation film on the insulating film of the first substrate and the separation film on the insulating film of the second substrate;

a second step of bonding the first substrate and the second substrate to each other, with the surface of the first substrate on which the separation film is formed and the surface of the second substrate on which the separation film is formed facing each other, to form an integrated substrate; and a third step of thinning the integrated substrate.

* * * * *